United States Patent
Fukumoto et al.

(10) Patent No.: US 7,847,201 B2
(45) Date of Patent: Dec. 7, 2010

(54) STORAGE CASE AND METHOD OF ASSEMBLING THE SAME

(75) Inventors: Tetsuya Fukumoto, Owariasahi (JP); Toshio Saito, Nagoya (JP); Kazushi Kadogaki, Kasugai (JP); Takeshi Yasuda, Nagoya (JP)

(73) Assignee: Omron Automotive Electronics Co., Ltd., Komaki, Achi (JP)

( * ) Notice: Subject to any disclaimer, the term of this patent is extended or adjusted under 35 U.S.C. 154(b) by 1595 days.

(21) Appl. No.: 11/138,131

(22) Filed: May 26, 2005

(65) Prior Publication Data

US 2005/0263529 A1    Dec. 1, 2005

(30) Foreign Application Priority Data

May 31, 2004    (JP) ............................. 2004-160655

(51) Int. Cl.
   *H05K 7/14*    (2006.01)
(52) U.S. Cl. .......................... 174/545; 174/59; 361/752
(58) Field of Classification Search ............... 174/50, 174/535, 59, 545; 361/752
   See application file for complete search history.

(56) References Cited

U.S. PATENT DOCUMENTS

| | | | |
|---|---|---|---|
| 4,836,408 A | | 6/1989 | Roy |
| 5,347,160 A | * | 9/1994 | Sutrina ....................... 257/698 |
| 5,872,332 A | * | 2/1999 | Verma ......................... 174/386 |
| 5,920,034 A | * | 7/1999 | Saka et al. ..................... 174/59 |
| 6,407,925 B1 | * | 6/2002 | Kobayashi et al. .......... 361/752 |
| 6,552,911 B1 | * | 4/2003 | Haupt et al. ................. 361/752 |
| 6,800,807 B2 | * | 10/2004 | Ishiguro et al. ............... 174/50 |

(Continued)

FOREIGN PATENT DOCUMENTS

FR    2 500 980 A    9/1982

(Continued)

OTHER PUBLICATIONS

Patent Abstracts of Japan, Publication No. 09-181461 dated Jul. 11, 1997, 2 pages.

(Continued)

*Primary Examiner*—Hung V Ngo
(74) *Attorney, Agent, or Firm*—Osha Liang LLP

(57) ABSTRACT

In order to prevent rattling and avoid generation of chips at the time of assembly in a storage case for a power steering control unit of a vehicle, a storage case includes a base having a plate-shaped substrate member, and a box-shaped cover having an opening on the lower side and being mounted on the base so as to cover the upper surface of the substrate member, wherein rattling preventing projections are provided at a plurality of positions on the peripheral edge of the substrate member so as to come into abutment with an opening-side edge of the cover, which is positioned at a mounting position with respect to the base, from the outside; on the inner side of the rattling-preventing projections bevels are formed, which presses the opening-side edge to resiliently deform the peripheral wall of the cover inward and causes a reaction force to act in a direction in which the cover moves away from the substrate member and comes apart from the base; and the opening-side edge is formed with a crimping projection formed by being bent toward the lower surface of the substrate member so as to retain the cover at the mounting position against the reaction force.

20 Claims, 4 Drawing Sheets

U.S. PATENT DOCUMENTS 6,927,337 B2 * 8/2005 Kobayashi et al. .......... 174/535
7,078,620 B2 * 7/2006 Ikeda et al. .................. 174/50

FOREIGN PATENT DOCUMENTS

| JP | 61-63885 U | 4/1986 |
| JP | 61-75191 U | 5/1986 |
| JP | 07-312483 A | 11/1995 |
| JP | 9-181461 | 7/1997 |
| JP | 10-98276 | 4/1998 |

OTHER PUBLICATIONS

Patent Abstracts of Japan, Publication No. 10-098276 dated Apr. 14, 1998, 2 pages.

European Search Report issued in European Application No. 05 00 5519 mailed Apr. 17, 2008, 3 pages.

* cited by examiner

STORAGE CASE AND METHOD OF ASSEMBLING THE SAME

BACKGROUND OF THE INVENTION

1. Field of the Invention

The present invention relates to a technology for implementing rattling prevention of a control unit, which is to be mounted on a vehicle or the like.

2. Description of Related Art

As a structure for preventing rattling and abnormal noise etc. caused thereby in a storage case for storing a control unit for a power steering or the like in a vehicle, for example, the ones described in Patent Document 1 or Patent Document 2 are known.

In other words, the structure in Patent Document 1 is a part storage case of a structure including an inner plate and an outer plate provided on a base, a peripheral wall of a bottomless box-shaped cover inserted between the inner plate and the outer plate, a window provided on the peripheral wall of the cover, an outward projection to be fitted to the window on the inner plate, an inward projection for pressing the peripheral wall inward on the outer plate, wherein only upper and lower bevels of the outer projection come into sliding contact with the upper and lower sides of the window.

In Patent Document 2, there is described a fitting structure between a case and a lid including: a guide (flange) provided on a plate-shaped lid to be fitted to an opening of a box-shaped case; the guide coming into abutment with an inner wall near an end edge of the opening of the case; the lid being fitted to the case along the guide, wherein a surface of the guide which comes into abutment with a corner of the end edge of the opening of the case is formed with a tapered rib so as to project therefrom and incline toward the plate-shaped lid from the guide, the case is formed with a thinned portion having a reduced thickness at a position corresponding to the rib, and the thinned portion climbs over the rib and hence is deformed when the case and the lid are fitted.

Patent Document 2 also describes a fitting structure between a case and a lid including: a guide (flange) provided on a plate-shaped lid to be fitted to an opening of a box-shaped case; the guide coming into abutment with an inner wall near an end edge of the opening of the case; the lid being fitted to the case along the guide, wherein a surface of the guide which comes into abutment with a corner of the end edge of the opening of the case is formed with a tapered rib formed of resin contained material so as to project therefrom and incline toward the plate-shaped lid from the guide, and the corner of the end edge of the opening of the case is adapted to chip the rib away when the case and the lid are fitted. In this structure, it is also described that the lid further includes a recess in the vicinity of the rib for storing chips generated by the corner of the end edge of the opening of the case.

[Patent Document 1] JP-A-9-181461
[Patent Document 2] Japanese Patent No. 2978120

However, the storage case in the related art described above has a following problem to be solved. In the structure of Patent Document 1, it is necessary to increase the dimensional accuracy of the base or the like significantly in order to prevent rattling, and hence it is eventually difficult to prevent rattling.

The reason is as follows. In order to prevent rattling in the structure disclosed in Patent Document 1, it is necessary to achieve a clamping state in which the peripheral wall of the cover is clamped by a certain extent of pressure between the inner plate and the outer plate (the inward projection of the outer plate presses the peripheral wall of the cover and the upper and lower bevels of the outward projection of the inner plate are in press contact with the upper and lower sides of the window of the peripheral wall of the cover), that is, a state in which a reaction force from the peripheral wall of the cover is exerted to the inner plate and the outer plate, and hence they are resiliently deformed inwardly and outwardly. However, since the inner plate and the outer plate are members which are provided on the base so as to project therefrom (provided in substantially upright posture) and are short in the vertical direction, the displaceable amount which can be resiliently deformed is small. Therefore, when the margin of error in dimension of the inner plate or the outer plate, or in thickness of the peripheral wall of the cover, etc. is large, it is highly likely that the inner plate or the outer plate is deformed beyond the resiliently deformable limit depending on the cases, and hence the inner plate or the outer plate becomes damaged or is resulted in plastic deformation (permanent deformation), which may lead malfunction of the clamping state and thus rattling. Alternatively, in contrast to it, it is highly likely that a clearance is generated between the peripheral wall of the cover and the respective plates due to the dimensional error and hence the clamping state cannot be achieved at the time of assembly, and abnormal noise or cracks, etc. due to rattling are resulted.

In particular, when the base is formed of metal such as aluminum casting and the cover is formed by pressing a steel plate in order to efficiently release heat generated by a stored electric circuit outward, it is difficult to improve the dimensional accuracy of the inner plate, the outer plate, or the peripheral wall of the cover, and hence the above-described problem can easily be generated. When the base or the cover is formed of metal as described above, a large noise or abnormal vibrations may easily be generated due to rattling. However, with the structure disclosed in Patent Document 1, such problems cannot be solved easily and sufficiently from the reasons described above.

In Patent Document 1, when the peripheral wall of the cover is inserted between the inner plate and the outer plate, the inward projection of the outer plate and the peripheral wall of the cover, and the outward projection of the inner plate and the peripheral wall of the cover come into slide contact with each other (it is not possible to assemble without sliding contact). Therefore, there arises a problem such that generation of the chips due to sliding contact cannot be avoided. The chips may cause malfunction or short-circuit and hence burning of the stored electric circuit particularly when they are formed of metal. Therefore, in the case of the vehicle-mounted equipment which requires reliability, generation of such chips is not accepted.

The structure of Patent Document 2 is a structure in which the end edge (thinned portion) of the opening of the case climbs over the rib formed on the guide of the lid and hence is deformed when the case and the lid are fitted together, or a structure in which the corner of the end edge of the opening of the case chips the rib formed of resin contained material away. Therefore, the chips are inevitably generated or the probability of generation of the chips is significantly high, and hence it cannot be applied to the vehicle-mounted equipment. Although there is a description in Patent Document 2 such that the recess is formed in the vicinity of the rib of the lid to store the chips generated by the corner of the end edge of the opening of the case, there is no guarantee that the chips do not enter into the interior of the storage case (for example, on the electric circuit therein), and as long as the chips are generated, it is difficult to apply this structure to the vehicle-mounted equipment which requires reliability.

In the case of the latter structure in Patent Document 2 (the structure in which the rib of resin contained material is provided), if the case or the lid is formed of metal as described above, it is necessary to form only the rib portion of resin contained material, and hence the manufacturing cost may increase.

SUMMARY OF THE INVENTION

In view of such problems described above, it is an object of the invention to provide a storage case of a new structure in which generation of rattling can be prevented and a method of assembling the same.

A storage case of this application is a storage case including a base having a plate-shaped substrate member, and a box-shaped cover having an opening on the lower surface and being mounted on the base so as to cover the upper surface of the substrate member, wherein rattling-preventing projections are provided at a plurality of positions on a peripheral edge of the substrate member so as to come into abutment with an opening-side edge of the cover which is positioned at a mounting position with respect to the base from the outside, the rattling-preventing projections are formed on the inner side thereof with bevels which presses the opening-side edge to resiliently deform a peripheral wall of the cover inward and causes a reaction force to act in a direction in which the cover moves away from the substrate member, the opening-side edge of the cover is formed with a crimping projection formed by being bent toward the lower surface of the substrate member so as to retain the cover at the mounting position against the reaction force.

In this storage case, in an assembled state, the peripheral wall of the cover is resiliently deformed inwardly and the reaction force from the rattling-preventing projection (bevel) of the base is exerted to the opening-side edge of the cover in the direction in which the cover moves away from the base. On the other hand, the crimping projection bent toward the lower surface of the substrate member retains the cover at the mounting position against the reaction force. In other words, the cover in the assembled state is fixed to the base mainly in a state in which the peripheral wall thereof is resiliently deformed (tensed state) due to a reaction force from the rattling preventing projection described above and a drag by the crimping projection. Therefore, rattling (relative displacement of the cover with respect to the base) is prevented, whereby abnormal noise, abnormal vibrations, damage of members, etc. caused by the rattling are also prevented.

Since the storage case in this application has a structure in which the peripheral wall of the cover is resiliently deformed inwardly by the rattling-preventing projections, it is easy to avoid sliding contact between the rattling-preventing projections and the peripheral wall of the cover (opening-side edge of the cover) at the time of assembly (when mounting the cover on the base). In other words, by assembling according to a method of assembly described later, generation of chips caused by sliding contact between the rattling-preventing projections and the peripheral wall of the cover (opening-side edge of the cover) can be prevented with high degree of reliability.

The method of assembly according to the present application is a method of assembling the storage case described above, including: a positioning step of moving the cover to the mounting position with respect to the base while avoiding contact between the opening-side edge of the cover and the rattling-preventing projections by resiliently deforming the peripheral wall of the cover inwardly by pressing the outer surface of the opening-side edge of the cover from the outside so that the opening-side edge and the rattling-preventing projections are in contact when positioning is completed; and a crimping step of bending the crimping projection of the cover in a state of being positioned by the positioning step toward the lower surface of the substrate member.

According to the method of assembly described above, sliding contact between the rattling-preventing projections and the peripheral wall of the cover (opening-side edge of the cover) at the time of assembly can be avoided, and generation of the chips due to sliding contact can be avoided with high degree of reliability.

The operation of pressing the outer surface of the opening-side edge of the cover from the outside in the positioning step may be performed by manpower, but it may also be performed using a machine or a jig. For example, it is also possible to employ a machine having a mechanism to hold the cover and determine the position in the fore-and-aft direction or the lateral direction with respect to the base, and then move the cover downward to the mounting position with respect to the base, and including rotatable rollers provided at positions where the outer peripheral surfaces thereof can press the peripheral wall (opening-side edge) of the cover, which is moving downward, inwardly by a predetermined amount, in a state of being fixed at the position of a shaft thereof. With such a machine, the positioning step can be implemented automatically with a simple structure only including an actuator for causing the cover to move relatively downward. In addition, since this structure can also prevent sliding contact between the rattling-preventing projections and the peripheral wall (opening-side edge) of the cover by pressing the peripheral wall (opening-side edge) of the cover, which is moving downward, with the outer peripheral surfaces of the rotating rollers, the peripheral wall of the cover is prevented from becoming damaged.

A pressing state in which the outer surface of the opening-side edge of the cover is pressed from the outside (for example, the state of pressing by the rollers) may be released after the positioning step is completed or the crimping step is completed. When the crimping step is completed and the pressing state is released, the cover is brought into the state of resiliently deformed to prevent rattling.

According to the storage case of the present invention, rattling (relative displacement of the cover with respect to the base) is prevented, and the problems such as generation of abnormal noise or abnormal vibrations, or damage of the members caused by the rattling are prevented. Furthermore, generation of the chips at the time of assembly can be prevented with high degree of reliability.

DESCRIPTION OF PREFERRED EMBODIMENTS

Figure 1:
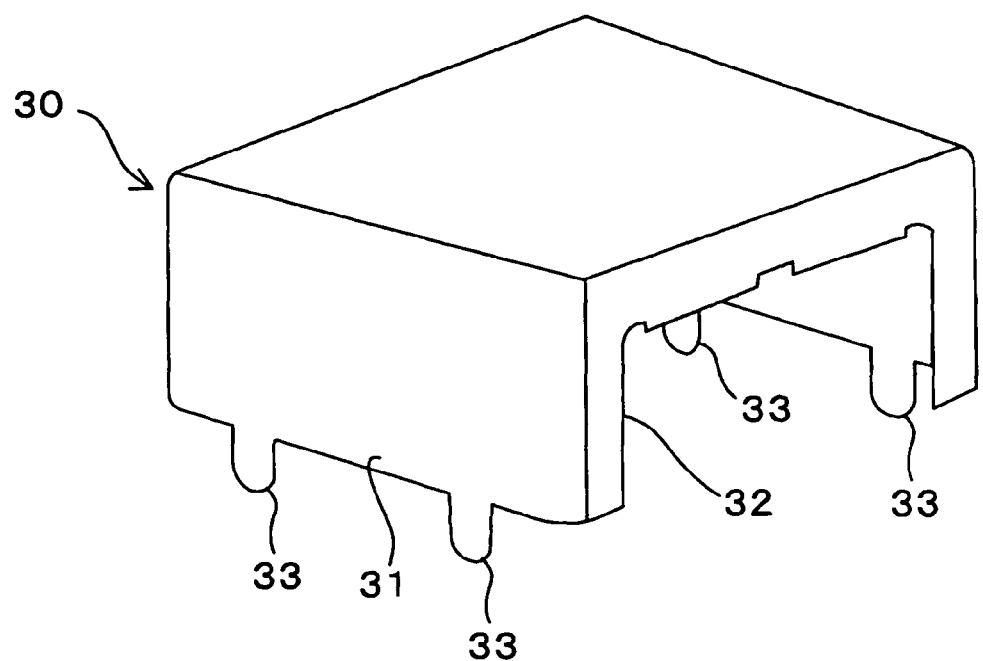
FIG. 1 is a perspective view showing a control unit (including a storage case) (before a cover is mounted).
Figure 1:
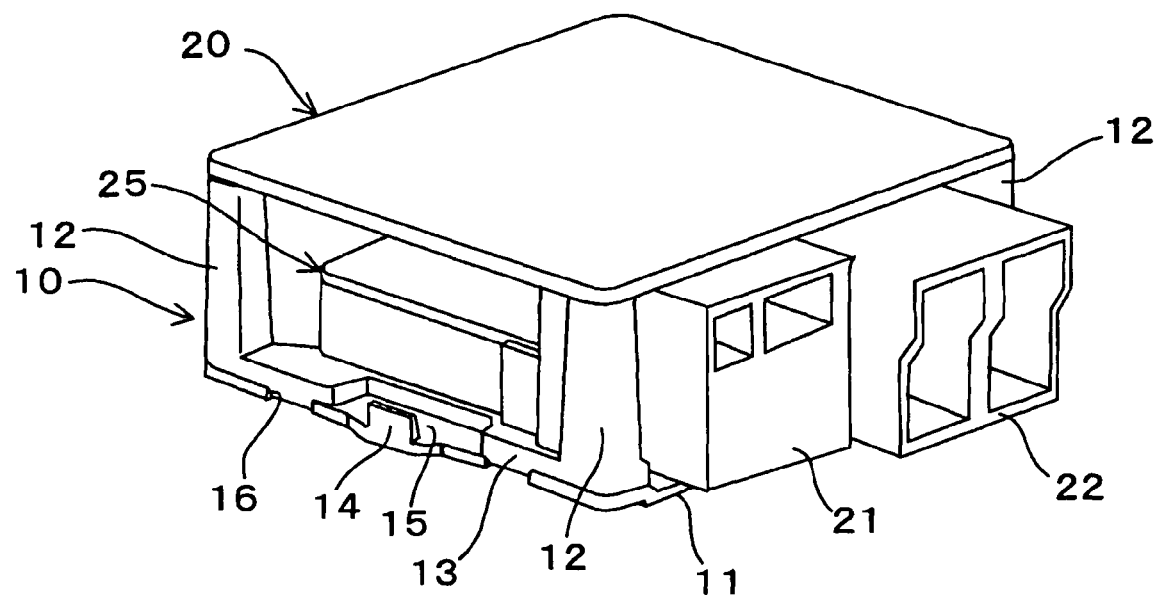

Referring now to the drawings, an embodiment of the present invention will be described.

Figure 2:
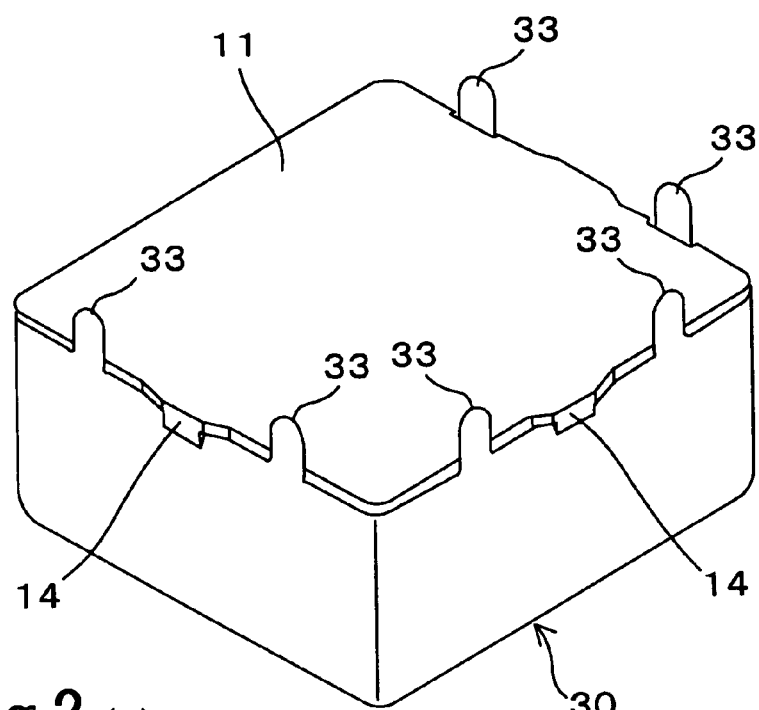
FIGS. 2A and 2B are perspective views showing states before and after a crimping step of the storage case.
Figure 2:
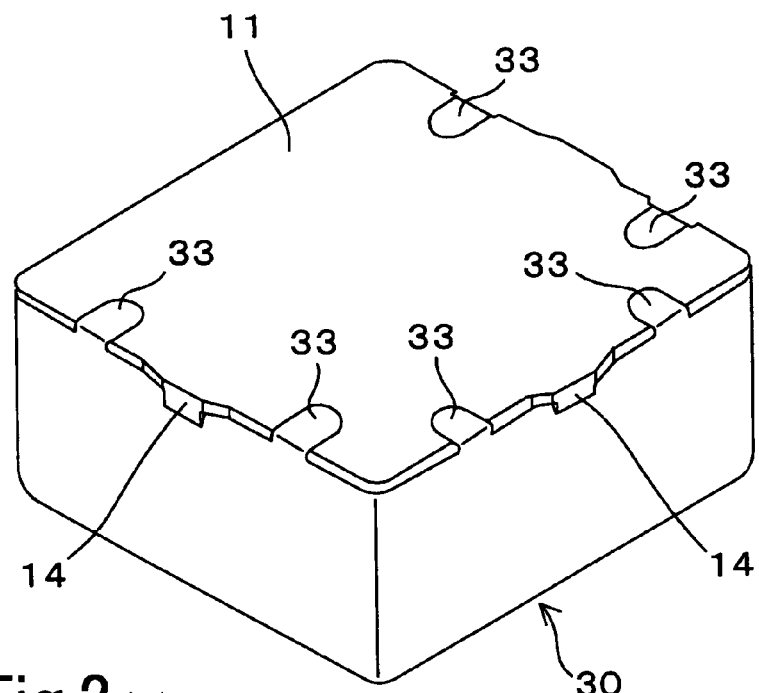
Figure 3:
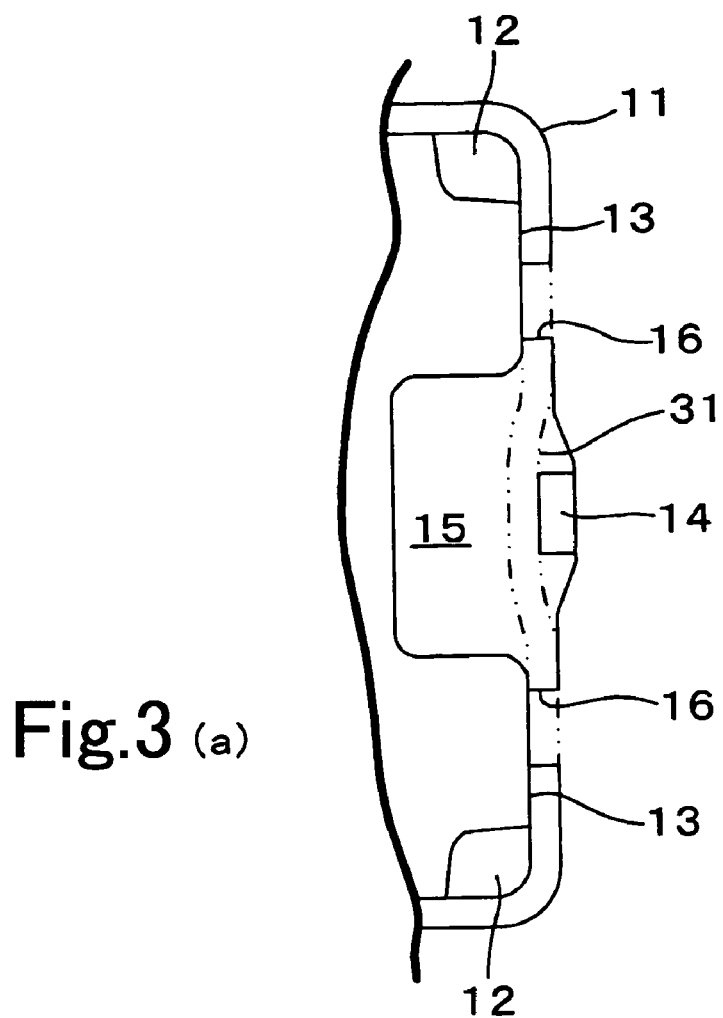
FIG. 3A is a plan view showing a principal portion of a base.
FIG. 3B is a cross-sectional side view explaining a positioning step of the storage case.
Figure 3:
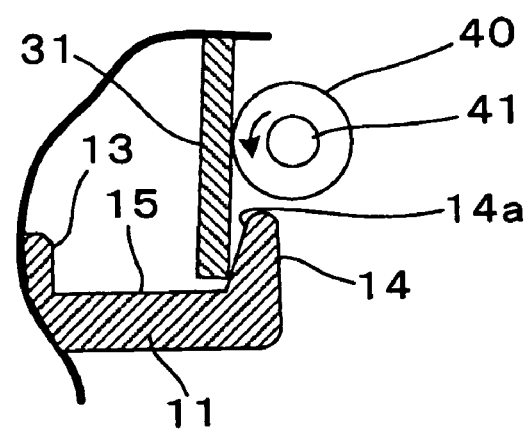
Figure 4:
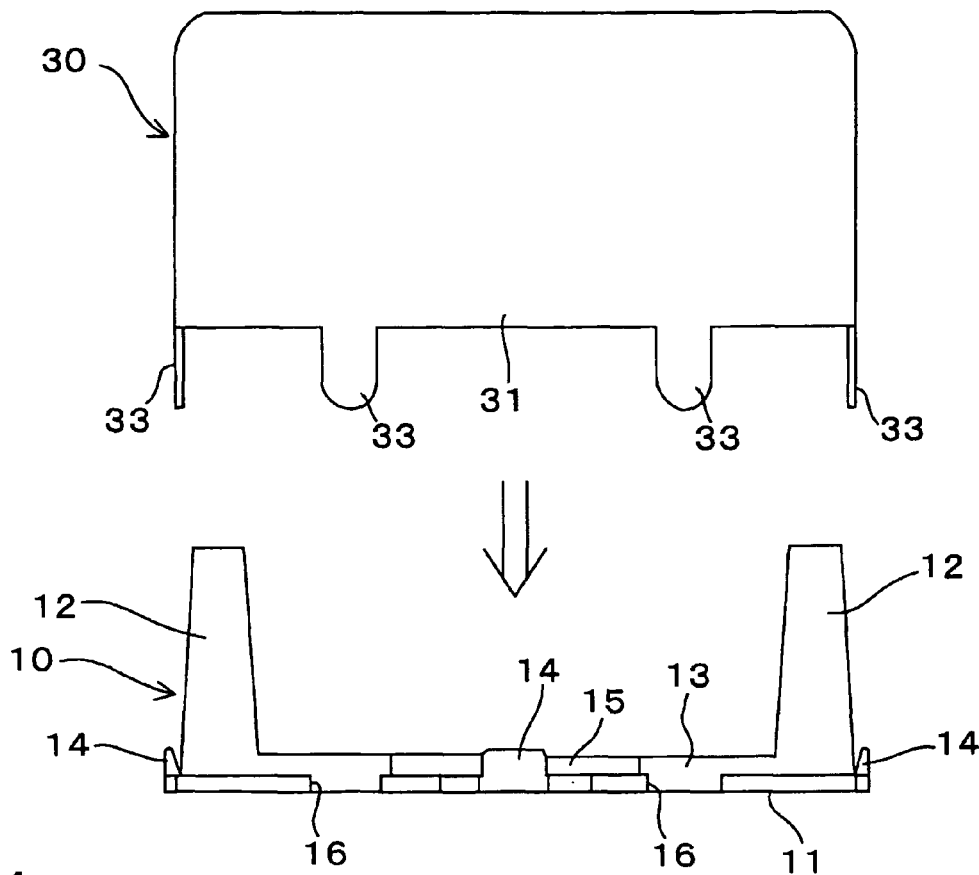
FIG. 4A is a side view showing an initial state of the positioning step of the storage case.
FIG. 4B is a perspective view explaining a state after the storage case is assembled.
Figure 4:
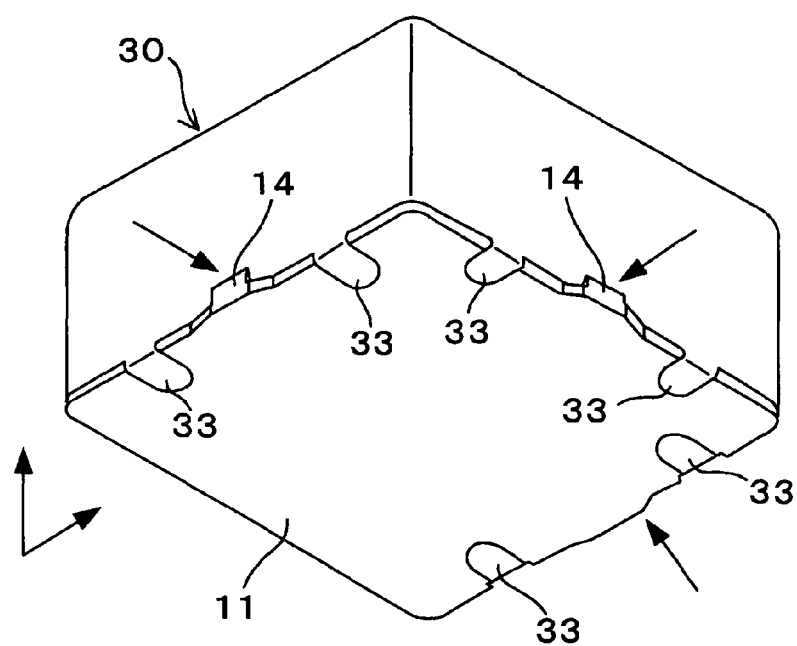

This embodiment is a control unit in an electric power steering system for a vehicle, which will be described referring to FIG. 1 to FIG. 4. FIG. 1 is an exploded perspective view (a state before mounting a cover) showing the control unit (including a storage case). FIGS. 2A, 2B are perspective views showing states before and after a crimping step of the storage case. FIG. 3A is a plan view showing a principal portion of a base. FIG. 3B is a cross-sectional side view explaining a positioning step of the storage case. FIG. 4A is a side view showing an initial state of the positioning step of the storage case. FIG. 4B is a perspective view explaining a state after the storage case is assembled.

The control unit of this embodiment includes a base 10, a square circuit substrate 20 mounted to the base 10, and a box-shaped cover 30 mounted on the upper surface of the base 10 so as to cover the circuit substrate 20. A switching device (normally, FET) for PWM (pulse width modulation)-driving an assist motor of a power steering system is mounted on a metal substrate 25, which is disposed inside the circuit substrate 20 separately from the circuit substrate 20 and connected to the circuit substrate 20 via a terminal. The metal substrate 25 is bonded on the base 10, so that heat generated at the switching device is efficiently discharged outside via the base 10. Components represented by reference numerals 21, 22 in FIG. 1 are connectors of the circuit substrate 20. The base 10 is formed of metal die, for example, of aluminum, and the cover 30 is fabricated by press-cutting processing or deformation processing (deep drawing or bending, etc.) of, for example galvanized sheet iron. The base 10 and the cover 30 constitute the storage case of this embodiment.

The base 10 includes a square plate-shaped substrate member 11 and four leg portions 12 provided at four corners on the upper surface of the substrate member 11 so as to project upward.

The base 10 includes a guide surface (flange surface) 13 extending in the vertical direction at a position slightly inside a peripheral edge of the upper surface of the substrate member 11. The guide surface 13 opposes the inner surface of an opening-side edge 31 of the cover 30 moving to the mounting position with respect to the base 10 with a small clearance and guides the cover 30 to the mounting position. The outer peripheries of the leg portions 12 correspond to part of the guide surface 13.

Rattling-preventing projections 14 which come into abutment with the opening-side edge of the cover 30 positioned at the mounting position from the outside are provided at predetermined position of the peripheral edge of the substrate member 11 (the respective centers of three sides except for the side on which the connectors 21, 22 are to be disposed). Then, on the inner sides of the rattling-preventing projections 14 bevels 14a are formed for pressing the opening-side edge 31 of the cover 30 to resiliently deform the peripheral wall of the cover 30 inward and bringing a reaction force to act in the direction to cause the cover 30 to move away from the substrate member 11 and be released from the base 10 as shown in FIG. 3B. The shape, being shown in FIG. 3B, is inclined outward when viewed from near the center of the substrate member 11.

The guide surface 13 is, as shown in FIG. 3A, recessed inwardly on the backside of the rattling-preventing projections 14, whereby a recess 15 is formed. The recess 15 serves as a release for enabling inward resilient deformation of the peripheral wall of the cover 30.

Provided on both sides of the rattling-preventing projections 14 on the peripheral edge of the substrate member 11 are notches 16 for disposing (inserting) crimping projections 33, described later, of the cover 30.

The circuit substrate 20 is secured by screws at four corners with respect to the respective leg portions 12 (not shown).

The cover 30 is a box-shaped rectangular solid with an opening lower surface, and is formed at the positions of the peripheral wall thereof where the connectors 21, 22 are to be disposed with notches 32 for avoiding interference with the connectors 21, 22. Formed at predetermined positions on the opening-side edge of the cover 30 (the positions corresponding to both sides of the rattling-preventing projections 14) are tongue-shaped crimping projections 33 formed into semicircular shape at the distal ends thereof so as to project from the opening-side edge. The crimping projections 33 are bent toward the lower surface (rear surface) of the substrate member 11 in a state in which the cover 30 is mounted, so that the cover 30 is retained at the mounting position against the reaction force.

In this storage case, in an assembled state, the peripheral wall of the cover is resiliently deformed inwardly and the reaction force from the rattling-preventing projection 14 (bevel 14a) of the base 10 is exerted to the opening-side edge 31 of the cover in the direction in which the cover 30 moves away from the base 10. On the other hand, the crimping projection 33 bent toward the lower surface of the substrate member 11 retains the cover 30 at the mounting position against the reaction force. In other words, the cover 30 in the assembled state is fixed to the base 10 mainly in a state in which the peripheral wall thereof is resiliently deformed (tensed state) due to a reaction force from the rattling preventing projection 14 described above and a drag by the crimping projection 33, as shown in FIG. 4B. Therefore, rattling (relative displacement of the cover 30 with respect to the base 10) is prevented, whereby abnormal noise, abnormal vibrations, damage of members, etc. caused by the rattling are also prevented.

Since the storage case has a structure in which the peripheral wall of the cover is resiliently deformed inwardly by the rattling-preventing projections 14, it is easy to avoid sliding contact between the rattling-preventing projections 14 and the peripheral wall of the cover (opening-side edge of the cover 31) at the time of assembly (when mounting the cover 30 on the base 10). In other words, by assembling according to a method of assembling described later, generation of chips caused by sliding contact between the rattling-preventing projections and the peripheral wall of the cover (opening-side edge 31 of the cover) can be prevented with high degree of reliability.

Subsequently, a method of assembling the storage case of the embodiment will be described.

The method of assembling the storage case according to this embodiment includes a positioning step and a crimping step.

The positioning step includes the steps of positioning the cover 30 in the fore-and-aft direction and lateral direction with respect to the base 10 so that the peripheral wall of the cover 30 is located outside the aforementioned guide surface 13 and the aforementioned crimping projections 33 are located exactly above the notches 16, and, in this state, as shown in FIG. 4A, moving the cover 30 downwardly with respect to the base 10, and moving the cover 30 to the mounting position and positioning the same with respect to the base 10. This positioning step includes the steps of moving the cover 30 to the mounting position with respect to the base 10 while avoiding contact (sliding contact) between the opening-side edge 31 of the cover 30 and the rattling-preventing projections 14 by resiliently deforming the opening-side edge 31 of the cover 30 inwardly as shown in FIG. 3A by a chain line by pressing the outer surface of the opening-side edge 31 of the cover 30 from the outside.

The mounting position means a state in which the cover 30 is moved with respect to the base 10 as described above and the opening-side edge 31 of the cover 30 is bonded to the substrate member 11 of the base 10 (shown in FIG. 2A).

The crimping step is a step of bending the crimping projections 33 of the cover 30 in a state of being positioned in the positioning step toward the lower surface (back surface) of the substrate member 11 as shown in FIG. 2B.

According to this method of assembly, sliding contact between the rattling-preventing projections 14 and the peripheral wall of the cover (the opening-side edge 31 of the cover) at the time of assembly can be avoided, whereby generation of the chips due to the sliding contact can be avoided with high degree of reliability.

Since there is provided a small clearance between the guide surface 13 of the substrate member 11 and the peripheral wall of the cover (opening-side edge 31 of the cover), they are prevented from coming into sliding contact with each other. In particular, according to this embodiment, since the crimping projections 33 having the rounded distal ends move to the position opposing to the guide surface 13 first and serve as guides, chipping away of the guide surface 13 of the substrate member 11 by the distal end of the opening-side edge 31 of the cover can hardly occur.

Therefore, according to this embodiment, the probability of generation of the chips at the time of assembly is very low.

In this positioning step, the operation of pressing the outer surface of the opening-side edge 31 of the cover 30 from the outside may be performed by manpower, but it may also be performed using a machine or a jig. For example, it is also possible to employ a machine having a mechanism to hold the cover 30 and determine the position in the fore-and-aft direction or the lateral direction with respect to the base 10, and then move the cover 30 downward to the mounting position with respect to the base 10, and including rotatable rollers (represented by reference numeral 40 in FIG. 3B) provided at positions where the outer peripheral surfaces thereof can press the peripheral wall (opening-side edge) of the cover 30, which is moving downward, inwardly by a predetermined amount, in a state of being fixed at the position of a shaft (represented by reference numeral 41 in FIG. 3B) thereof. With such a machine, the above-described positioning step can be implemented automatically with a simple structure only including an actuator for causing the cover 30 to move relatively downward.

In addition, since this structure can also prevent sliding contact between the rattling-preventing projections 14 and the peripheral wall (opening-side edge 31) of the cover by pressing the peripheral wall (opening-side edge 31) of the cover, which is moving downward, with the outer peripheral surfaces of the rotating rollers 40, the peripheral wall of the cover is prevented from becoming damaged.

A pressing state in which the outer surface of the opening-side edge 31 of the cover 30 is pressed from the outside (for example, the state of pressing by the rollers 40) may be released after the positioning step is completed or the crimping step is completed. When the crimping step is completed and the pressing state is released, the cover is brought into the state of resiliently deformed to prevent rattling.

The present invention is not limited to the above-described embodiment, but various modifications or applications are possible.

For example, when the size of the storage case is large, a larger number of rattling-preventing projections or crimping projections may be provided.

Although the side of the base to which the cover is mounted is described to be the upper surface in this application, this relation may be vice-versa, and in terms of the actual mounting state an upper surface of the base may be inclined with respect to the horizon.

What is claimed is:

1. A storage case comprising:
a base having a plate-shaped substrate member; and
a box-shaped cover having an opening on a lower surface and being mounted to the base so as to cover an upper surface of the substrate member,
wherein rattling-preventing projections are provided at a plurality of positions on a peripheral edge of the substrate member so as to come into abutment, from outside, with an opening-side edge of the cover, when the cover is positioned at a mounting position with respect to the base,
bevels are formed on an inner side of the rattling-preventing projections, the bevels press the opening-side edge to resiliently deform a peripheral wall of the cover inward and cause a reaction force which moves the cover away from the substrate member,
the opening-side edge of the cover is formed with a crimping projection, the crimping projection being bent toward a lower surface of the substrate member so as to retain the cover at the mounting position against the reaction force.

2. A method of assembling a storage case according to claim 1 comprising: a positioning step of moving the cover to the mounting position with respect to the base while avoiding contact between the opening-side edge of the cover and the rattling-preventing projections by resiliently deforming the peripheral wall of the cover inwardly by pressing an outer surface of the opening-side edge of the cover from the outside so that the opening-side edge and the rattling-preventing projections are in contact when positioning is completed; and
a crimping step of bending the crimping projection of the cover in a state of being positioned by the positioning step toward a lower surface of the substrate member.

3. The method of claim 2, wherein the pressing of the outer surface of the opening-side edge of the cover from outside is performed by a jig.

4. The method of claim 2, wherein the positioning step is performed by an actuator.

5. The method of claim 4, wherein the actuator moves the cover toward the base in the positioning step and, during the moving of the cover toward the base, the pressing of the outer surface of the opening-side edge of the cover from outside is performed by rotatable rollers.

6. The storage case of claim 1, wherein the rattling-preventing projections are provided at respective centers of a plurality of sides of the substrate member.

7. The storage case of claim 1, further comprising:
a switching device mounted on the substrate member.

8. The storage case of claim 7, wherein the switching device is an FET.

9. The storage case of claim 7, further comprising:
a vehicle having a power steering system with an assist motor,
wherein the switching device drives the assist motor of the power steering system of the vehicle.

10. The storage case of claim 9, wherein the switching device drives the assist motor using pulse width modulation.

11. The storage case of claim 1, wherein the substrate is square.

12. The storage case of claim 1, wherein distal ends of the crimping projections are formed into semi-circular shapes.

13. A storage case comprising:

a base having a substrate member;

a box-shaped cover having an opening on a lower surface and being mounted to the base so as to cover an upper surface of the substrate member, rattling-preventing means provided at a plurality of positions on a peripheral edge of the substrate member so as to come into abutment, from outside, with an opening-side edge of the cover, when the cover is positioned at a mounting position with respect to the base, pressing means for pressing the opening-side edge to resiliently deform a peripheral wall of the cover inward and cause a reaction force which moves the cover away from the substrate member, cover retention means formed at the opening-side edge of the cover, the cover retention means for retaining the cover at the mounting position against the reaction force.

14. A storage case comprising:

a base having a substrate member;

a cover having an opening on a lower surface and being mounted to the base so as to cover an upper surface of the substrate member, a rattling-preventing projection provided on a peripheral edge of the substrate member so as to come into abutment, from outside, with an opening-side edge of the cover, when the cover is positioned at a mounting position with respect to the base, a bevel for pressing the opening-side edge to resiliently deform a peripheral wall of the cover inward and causing a reaction force which moves the cover away from the substrate member, a crimping projection formed at the opening-side edge of the cover, the crimping projection being bent toward a lower surface of the substrate member so as to retain the cover at the mounting position against the reaction force.

15. The storage case of claim 14, wherein the substrate is plate-shaped.

16. The storage case of claim 14, wherein the cover is box-shaped.

17. The storage case of claim 14, further comprising another rattling-preventing projection provided on another peripheral edge of the substrate member so as to come into abutment, from outside, with the opening-side edge of the cover, when the cover is positioned at the mounting position with respect to the base.

18. The storage case of claim 14, further comprising another bevel for pressing the opening-side edge to resiliently deform another peripheral wall of the cover inward and causing another reaction force which moves the cover away from the substrate member.

19. The storage case of claim 14, further comprising another crimping projection formed at the opening-side edge of the cover, the another crimping projection being bent toward the lower surface of the substrate member so as to retain the cover at the mounting position against the reaction force.

20. The storage case of claim 14, further comprising a control unit in a power steering system for a vehicle is disposed on the substrate.

* * * * *